United States Patent
Gwon et al.

(10) Patent No.: US 10,431,778 B2
(45) Date of Patent: Oct. 1, 2019

(54) ORGANIC LIGHT EMITTING DISPLAY DEVICE

(71) Applicant: LG Display Co., Ltd., Seoul (KR)

(72) Inventors: SeungJu Gwon, Paju-si (KR); SeMin Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/986,118

(22) Filed: May 22, 2018

(65) Prior Publication Data

US 2018/0342704 A1    Nov. 29, 2018

(30) Foreign Application Priority Data

May 25, 2017   (KR) ......................... 10-2017-0064598

(51) Int. Cl.
   *H01L 51/52* (2006.01)
   *H01L 27/32* (2006.01)

(52) U.S. Cl.
   CPC ...... *H01L 51/5281* (2013.01); *H01L 27/3246* (2013.01); *H01L 27/3258* (2013.01); *H01L 51/5275* (2013.01); *H01L 51/5293* (2013.01); *H01L 27/3244* (2013.01); *H01L 51/5237* (2013.01); *H01L 51/5253* (2013.01)

(58) Field of Classification Search
   CPC ............. H01L 51/5281; H01L 51/5293; H01L 51/5237; H01L 27/3246; H01L 27/3258; G02B 5/0236; G02B 5/0257; G02B 5/0263
   See application file for complete search history.

(56) References Cited

U.S. PATENT DOCUMENTS

| | | | | |
|---|---|---|---|---|
| 2007/0159580 A1* | 7/2007 | Yoshioka | ............. | G02B 5/3008 349/117 |
| 2010/0165458 A1* | 7/2010 | Park | ....................... | G03B 21/60 359/452 |
| 2012/0147284 A1* | 6/2012 | Kim | .................. | G02F 1/133555 349/43 |
| 2014/0021856 A1* | 1/2014 | Jung | ................... | H01L 51/5253 313/504 |
| 2014/0340753 A1 | 11/2014 | Kusama et al. | | |
| 2015/0380685 A1* | 12/2015 | Lee | ..................... | H01L 51/5243 257/40 |
| 2016/0095172 A1* | 3/2016 | Lee | ....................... | C23C 16/401 313/504 |

(Continued)

FOREIGN PATENT DOCUMENTS

| KR | 10-2012-0056131 A | 6/2012 |
|---|---|---|
| KR | 10-2014-0111647 A | 9/2014 |

(Continued)

*Primary Examiner* — Joseph C. Nicely
(74) *Attorney, Agent, or Firm* — Morgan, Lewis & Bockius LLP

(57) ABSTRACT

An organic light emitting display device is disclosed, which prevents non-uniform luminance and color deviation caused by a change of a viewing angle from occurring. The organic light emitting display device includes a first substrate having a display area and a non-display area; an organic light emitting diode arranged in the display area of the first substrate; and an anisotropic diffusion film arranged on the organic light emitting diode, having a diffusion property varied depending on an incident angle.

15 Claims, 10 Drawing Sheets

(56) References Cited

U.S. PATENT DOCUMENTS

| | | | |
|---|---|---|---|
| 2016/0116646 A1* | 4/2016 | Araki | G02B 6/0051 |
| | | | 349/112 |
| 2016/0282663 A1 | 9/2016 | Jang et al. | |
| 2016/0372703 A1* | 12/2016 | Khachatryan | H01L 51/5253 |
| 2017/0003422 A1 | 1/2017 | Sugiyama et al. | |
| 2017/0005292 A1* | 1/2017 | Lee | H01L 51/5256 |
| 2017/0149014 A1* | 5/2017 | Choi | H01L 51/52 |
| 2018/0013092 A1* | 1/2018 | Park | H01L 27/3216 |
| 2018/0047920 A1* | 2/2018 | Jang | B32B 5/145 |
| 2018/0068919 A1* | 3/2018 | Chung | H01L 51/00 |
| 2018/0138450 A1* | 5/2018 | Park | H01L 27/3211 |
| 2018/0151838 A1* | 5/2018 | Park | G06F 3/0412 |
| 2018/0257335 A1* | 9/2018 | Matsuo | B32B 7/02 |

FOREIGN PATENT DOCUMENTS

| | | |
|---|---|---|
| KR | 10-2016-0111961 A | 7/2016 |
| KR | 10-2016-0116162 A | 10/2016 |

* cited by examiner

ORGANIC LIGHT EMITTING DISPLAY DEVICE

CROSS REFERENCE TO RELATED APPLICATIONS

This application claims the benefit of the Korean Patent Application No. 10-2017-0064598 filed on May 25, 2017, which is hereby incorporated by reference for all purposes as if fully set forth herein.

BACKGROUND

Technical Field

The present invention relates to an organic light emitting display device.

Discussion of the Related Art

Recently, with the advancement of the information age, a demand for a display device for displaying an image has been increased in various forms. Therefore, various display devices such as liquid crystal display (LCD) devices, plasma display panel (PDP) devices, and organic light emitting display (OLED) devices have been used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

The organic light emitting display device emits light by using an anode, a light emitting layer, and a cathode. The organic light emitting device is categorized into a bottom emission type and a top emission type in accordance with an emission type. The anode electrode is used as a semi-transparent electrode in the top emission type and the cathode is used as a semi-transparent electrode in the bottom emission type, whereby a portion between the anode and the cathode may be used as optical cavity. At this time, in the organic light emitting display device, as light emitted from the light emitting layer is repeatedly reflected to the anode or the cathode, constructive interference occurs between reflected lights, whereby a micro cavity effect in which light is amplified occurs.

In this organic light emitting display device, light efficiency is increased by the micro cavity effect, but side luminance of the organic light emitting display device is deteriorated by destructive interference of partial light emitted from the light emitting layer, whereby luminance may be not uniform. Also, in the organic light emitting display device, as a viewing angle is changed, an optical path length between two constructed lights is increased, a constructive wavelength range moves to a short wavelength, whereby color deviation may occur in which a color viewed from a side is seen to be bluish.

SUMMARY

Accordingly, embodiments of the present disclosure are directed to an organic light emitting display device that substantially obviates one or more of the problems due to limitations and disadvantages of the related art.

An aspect of the present disclosure is to provide an organic light emitting display device that prevents non-uniform luminance and color deviation caused by a change of a viewing angle from occurring.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting display device comprises a first substrate having a display area and a non-display area; an organic light emitting diode arranged in the display area of the first substrate; and an anisotropic diffusion film arranged on the organic light emitting diode, having a diffusion property varied depending on an incident angle.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a preferred embodiment of an organic light emitting display device according to the present invention will be described in detail with reference to the accompanying drawings. Wherever possible, the same reference numbers will be used throughout the drawings to refer to the same or like parts. Also, in the following description of the present invention, if detailed description of elements or functions known in respect of the present invention is determined to make the subject matter of the present invention unnecessarily obscure, the detailed description will be omitted.

Hereinafter, the preferred embodiment of the present invention will be described in detail with reference to the accompanying drawings.

Figure 1:
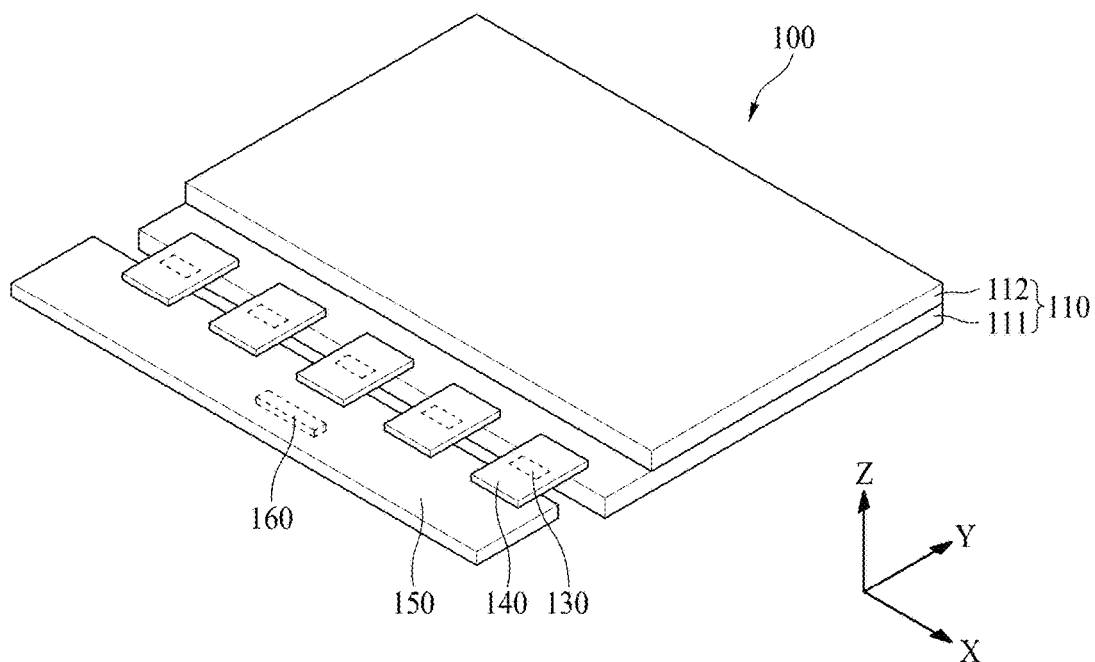
FIG. 1 is a perspective view illustrating an organic light emitting display device according to one embodiment of the present invention.
Figure 2:
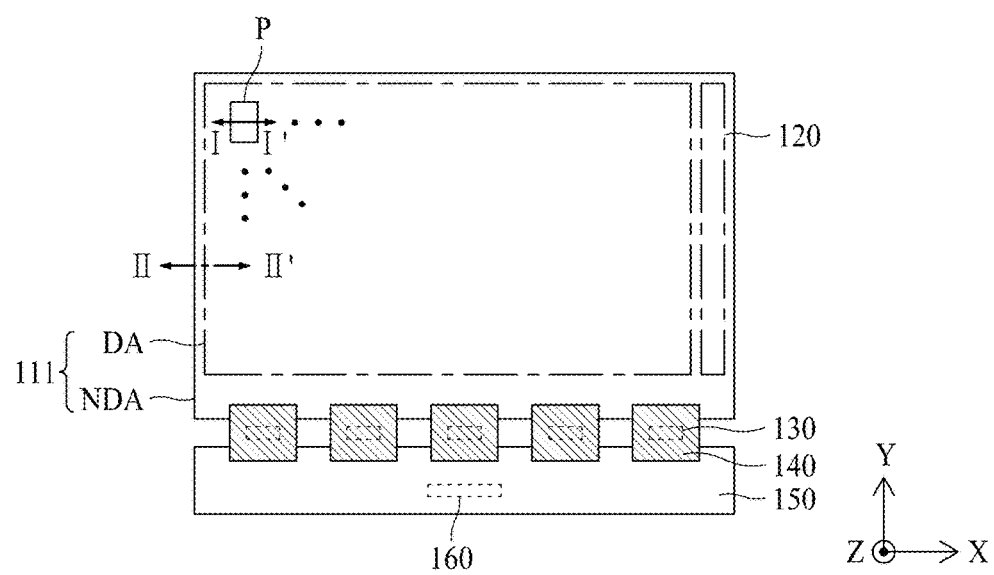
FIG. 2 is a plane view illustrating a first substrate, a gate driver, a source drive IC, a flexible film, a circuit board, and a timing controller of FIG. 1.

FIG. 1 is a perspective view illustrating an organic light emitting display device according to one embodiment of the present invention, and FIG. 2 is a plane view illustrating a first substrate, a gate driver, a source drive IC, a flexible film, a circuit board, and a timing controller of FIG. 1.

Referring to FIGS. 1 and 2, the organic light emitting display device 100 according to one embodiment of the present invention comprises a display panel 110, a gate driver 120, a source drive integrated circuit (hereinafter, referred to as "IC") 130, a flexible film 140, a circuit board 150, and a timing controller 160.

The display panel 110 includes a first substrate 111 and a second substrate 112. The second substrate 112 may be an encapsulation substrate and may be omitted. The first substrate 111 may be a plastic or a glass substrate.

Gate lines, data lines and pixels P are formed on one surface of the first substrate 111. The pixels P are provided in an area defined by a crossing structure of the gate lines and the data lines.

Each of the pixels P may include a thin film transistor, and an organic light emitting diode that includes a first electrode, an organic light emitting layer, and a second electrode. Each of the pixels P supplies a predetermined current to the organic light emitting diode in accordance with a data voltage of the data line if a gate signal is input from the gate line by using the thin film transistor. For this reason, the organic light emitting diode of each of the pixels P may emit light with a predetermined brightness in accordance with the predetermined current. A structure of each of the pixels P will be described later with reference to FIG. 3.

The display panel 110 may be categorized into a display area DA where the pixels P are formed to display an image and a non-display area NDA where an image is not displayed, as shown in FIG. 2. The gate lines, the data lines and the pixels P may be formed on the display area DA. The gate driver 120 and pads may be formed on the non-display area NDA.

The gate driver 120 supplies gate signals to the gate lines in accordance with a gate control signal input from the timing controller 160. The gate driver 120 may be formed on the non-display area NDA outside one side or both sides of the display area DA of the display panel 110 in a gate driver in panel (GIP) mode. Alternatively, the gate driver 120 may be fabricated of a driving chip, packaged in a flexible film and attached to the non-display area NDA outside one side or both sides of the display panel 110 in a tape automated bonding (TAB) mode.

The source drive IC 130 receives digital video data and a source control signal from the timing controller 160. The source drive IC 130 converts the digital video data to analog data voltages in accordance with the source control signal and supplies the analog data voltages to the data lines. If the source drive IC 130 is fabricated of a driving chip, the source drive IC 130 may be packaged in the flexible film 140 in a chip on film (COF) or chip on plastic (COP) mode.

Pads such as data pads may be formed on the non-display area NDA of the display panel 110. Lines which connect the pads with the source drive IC 130 and lines which connect the pads with lines of the circuit board 150 may be formed in the flexible film 140. The flexible film 140 may be attached onto the pads by an anisotropic conducting film, whereby the pads may be connected with the lines of the flexible film 140.

The circuit board 150 may be attached to the flexible films 140. A plurality of circuits comprised of driving chips may be packaged in the circuit board 150. For example, the timing controller 160 may be packaged in the circuit board 150. The circuit board 150 may be a printed circuit board or a flexible printed circuit board.

The timing controller 160 receives digital video data and a timing signal from an external system board through a cable of the circuit board 150. The timing controller 160 generates a gate control signal for controlling an operation timing of the gate driver 120 and a source control signal for controlling the source drive ICs 130 on the basis of the timing signal. The timing controller 160 supplies the gate control signal to the gate driver 120, and supplies the source control signal to the source drive ICs 130.

Figure 3:
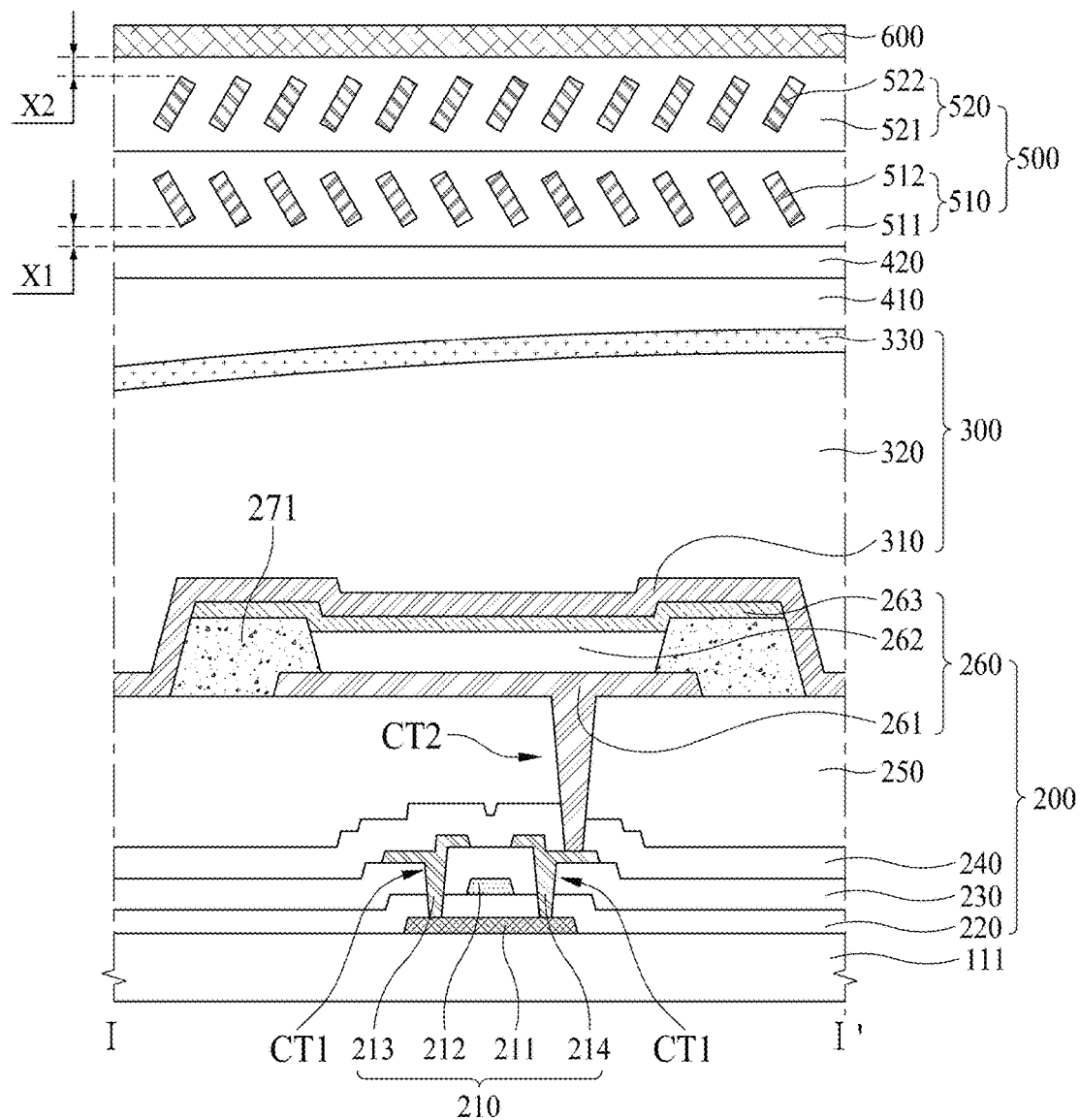
FIG. 3 is a cross-sectional view taken along line I-I' of FIG. 2, illustrating an organic light emitting display device according to the first embodiment of the present invention.

FIG. 3 is a cross-sectional view taken along line I-I of FIG. 2, illustrating an organic light emitting display device according to the first embodiment of the present invention.

Referring to FIG. 3, the organic light emitting display device according to the first embodiment of the present invention comprises a first substrate 111, a pixel array layer 200, an encapsulation layer 300, an adhesive layer 410, a barrier film 420, an anisotropic diffusion film 500, and a polarizer 600.

The first substrate 111 may include a plastic material or glass material as a base substrate. The first substrate 111 according to one embodiment may be made of a flexible plastic material, for example, opaque or colored PI (polyimide) material. The first substrate 111 according to one embodiment may be the substrate obtained by hardening a polyimide resin coated on a release layer provided in a relatively thick carrier substrate at a certain thickness. In this case, the carrier substrate is detached from the first substrate 111 by release of the release layer using a laser release process.

Additionally, the organic light emitting display device according to one embodiment of the present invention may further comprise a back plate coupled to a lower surface of the first substrate 111 based on a vertical axis direction (or thickness direction of the substrate). The back plate maintains the first substrate 111 at a plane state. The back plate according to one embodiment may include a plastic material, for example, PET (polyethyleneterephthalate) material. The back plate is laminated on the lower surface of the first substrate 111 detached from the carrier substrate, thereby maintaining the first substrate 111 at a plane state.

The pixel array layer 200 includes a plurality of pixels P provided on the first substrate 111, displaying an image.

The pixel array layer 200 according to one embodiment of the present invention includes a thin film transistor 210, a gate insulating film 220, an inter-layer dielectric film 230, a passivation film 240, a planarization film 250, an organic light emitting diode 260, and a first bank 271.

The thin film transistor 210 includes an active layer 211, a gate electrode 212, a source electrode 213, and a drain electrode 214.

The active layer 211 is formed on the first substrate 111. The active layer 211 may be formed of a silicon based semiconductor material or an oxide based semiconductor material. A light-shielding layer for shielding external light entering the active layer 211 and a buffer layer for protecting the thin film transistor and the organic light emitting diode 260 from water may additionally be arranged below the active layer 211.

The gate insulating film 220 is arranged on the active layer 211. The gate insulating film 220 may be formed of an inorganic film, for example, a silicon oxide film (SiOx), a silicon nitride film (SiNx) or a multi-layered film of the silicon oxide film and the silicon nitride film.

The gate electrode 212 is arranged on the gate insulating film 220. The gate line may be formed on the gate insulating film 220. The gate electrode 212 and the gate line may be formed of a single layer or multi-layer comprised of any one of Mo, Al, Cr, Au, Ti, Ni, Nd and Cu or their alloy.

The inter-layer dielectric film 230 is arranged on the gate electrode 212. The inter-layer dielectric film 230 may be formed of an inorganic film, for example, a silicon oxide film (SiOx), a silicon nitride film (SiNx), or a multi-layered film of the silicon oxide film and the silicon nitride film.

The source electrode 213 and the drain electrode 21 are arranged on the inter-layer dielectric film 230. The data line may be arranged on the inter-layer dielectric film 230. Each of the source electrode 213 and the drain electrode 214 may be connected to the active layer 211 through a contact hole CT1 that passes through the gate insulating film 220 and the inter-layer dielectric films 230. Each of the source electrode 213, the drain electrode 214 and the data line may be formed of a single layer or multi-layer comprised of any one of Mo, Al, Cr, Au, Ti, Ni, Nd and Cu or their alloy.

Meanwhile, although the thin film transistor 210 is formed in a top gate mode in which the gate electrode 212 is arranged above the active layer 211 as shown in FIG. 3, it is to be understood that the thin film transistor of the present invention is not limited to the top gate mode. That is, the thin film transistor 210 may be formed in a bottom gate mode in which the gate electrode 212 is arranged below the active layer 211 or a double gate mode in which the gate electrode 212 is arranged above and below the active layer 211.

The passivation film 240 may be arranged on the source electrode 213, the drain electrode 214 and the data line. The passivation film 240 insulates the thin film transistor 210. The passivation film 240 may be formed of an inorganic film, for example, a silicon oxide film (SiOx), a silicon nitride film (SiNx), or a multi-layered film of the silicon oxide film and the silicon nitride film.

The planarization film 250 is arranged on the passivation film 240. The planarization film 250 planarizes a step difference caused by the thin film transistor 210 on the passivation layer 240. The planarization film 250 may be formed of an organic film such as acrylic resin, epoxy resin, phenolic resin, polyamide resin, and polyimide resin.

The organic light emitting diode 260 and the first bank 271 are arranged on the planarization film 250. The organic light emitting diode 260 includes a first electrode 261, an organic light emitting layer 262, and a second electrode 263. The first electrode 261 may be an anode electrode, and the second electrode 263 may be a cathode electrode.

The first electrode 261 may be arranged on the planarization film 250. The first electrode 261 is connected to the drain electrode 214 of the thin film transistor 210 through a contact hole CT2 that passes through the passivation film 240 and the planarization film 250. The first electrode 261 may be formed of a metal material having high reflectivity such as a deposition structure (Ti/Al/Ti) of Al and Ti, a deposition structure (ITO/Al/ITO) of Al and ITO, an APC alloy, or a deposition structure (ITO/APC/ITO) of APC alloy and ITO. The APC alloy is an alloy of Ag, Pd and Cu.

The first bank 271 may be arranged on the planarization film 250 to overlap the first electrode 261. The first bank 271 is arranged on the first electrode 261 of the contact hole CT2. A light emitting area of the pixels P may be defined by an area where the first electrode 261, the organic light emitting layer 262, and the second electrode 263 are sequentially deposited to emit predetermined light. At this time, the first electrode 261, the organic light emitting layer 262, and the second electrode 263 may be deposited sequentially on an area where the first bank 271 is not arranged. Therefore, the first bank 271 serves to partition and define the light emitting area.

The organic light emitting layer 262 is arranged on the first electrode 261. The organic light emitting layer 262 according to one embodiment may include a red light emitting layer for emitting red light, a green light emitting layer for emitting green light, and a blue light emitting layer for emitting blue light. Therefore, each of the plurality of pixels P may include a red pixel, a green pixel and a blue pixel. The organic light emitting layer 262 according to another embodiment may be a white light emitting layer for emitting white light. In this case, the organic light emitting layer 262 may be formed in a tandem structure of two stacks or more. Each of the stacks may include a hole transporting layer, at least one light emitting layer, and an electron transporting layer. The organic light emitting layer 262 may be formed by a deposition process or a solution process. If the organic light emitting layer 262 is formed by the deposition process, the organic light emitting layer may be formed by an evaporation deposition method.

The second electrode 263 is arranged on the organic light emitting layer 262. The second electrode 263 may be arranged even on the first bank 271. The second electrode 263 may be formed of a transparent conductive material (TCO) such as ITO and IZO, which may transmit light, or a semi-transmissive conductive material such as Mg, Ag, and alloy of Mg and Ag. A capping layer may be arranged on the second electrode 263. The second electrode 263 may be formed by a physics vapor deposition such as sputtering.

The encapsulation layer 300 is arranged on the second electrode 263. The encapsulation layer 300 serves to prevent oxygen or water from being permeated into the organic light emitting layer 262 and the second electrode 263. To this end, the encapsulation layer 300 may include a plurality of layers that include at least one inorganic film and at least one organic film. The encapsulation layer 300 may be formed by a physics vapor deposition such as sputtering.

The encapsulation layer 300 according to one embodiment may include a first inorganic film 310, an organic film 320, and a second inorganic film 330. In this case, the first inorganic film 310 is arranged on the second electrode 263 to cover the second electrode 263. The organic film 320 is arranged on the first inorganic film 310 to cover the first inorganic film 310. Preferably, the organic film 320 is formed with a sufficient thickness to prevent particles from being permeated into the organic light emitting layer 262 and the second electrode 263 by passing through the first inorganic film 310. The second inorganic film 330 is arranged on the organic film 320 to cover the organic film 320.

The first inorganic film 310 is arranged to be closest to the organic light emitting diode 260, and is formed of an inorganic insulating material capable of low temperature deposition, such as a silicon nitride (SiNx), a silicon oxide (SiOx), a silicon oxide nitride (SiON), or an aluminum oxide ($Al_2O_3$). At this time, since the organic light emitting layer 262 is vulnerable to a high temperature, the first inorganic film 310 is formed at a low temperature atmosphere, for example, by a low temperature process of 100° C. or less. Therefore, in this embodiment, the organic light emitting diode 260 may be prevented from being damaged by a high temperature atmosphere applied to a process chamber during the process of forming the first inorganic film 310.

The organic film 320 is provided on the display area DA of the first substrate 111 to fully cover the upper surface of the first inorganic film 310. The organic film 320 serves to buffer a stress between the respective layers, which is caused by bending of the organic light emitting display device, and enhances planarization performance. The organic film 320 according to one embodiment may include an organic material such as BCB (benzocyclobutene), acryl, PI (polyimide), or SiOC.

The second inorganic film 330 is provided on the first substrate 111 to fully cover the upper surface of the organic film 320. The second inorganic film 330 prevents water or oxygen from the outside of the organic light emitting display device from being permeated into the organic film 320 and the first inorganic film 310. The second inorganic film 330 according to one embodiment is formed of an inorganic insulating material capable of low temperature deposition, such as a silicon nitride (SiNx), a silicon oxide (SiOx), a silicon oxide nitride (SiON), or an aluminum oxide ($Al_2O_3$).

The adhesive layer 410 is arranged on the encapsulation layer 300. The adhesive layer 410 is fully adhered to the encapsulation layer 300 and the barrier film 420 without an air layer, thereby fixing the encapsulation layer 300 to the barrier film 420. The adhesive layer 410 according to one embodiment of the present invention is made of a urethane based material, and has a self-stick property and flexibility. The adhesive layer 410 may planarize a lower surface which is not fully planarized, and is filled between surfaces which are not uniform and has a proper thickness to planarize its upper portion. The adhesive layer 410 according to one embodiment has a stick or adhesive property and transparency, and may be made of a barrier pressure sensitive adhesive (B-PSA) or/and an optically clear adhesive (OCA).

The barrier film 420 is arranged on the adhesive layer 410. The barrier film 420 encapsulates the organic light emitting diode 260 and the adhesive layer 410 to prevent the organic light emitting diode 260 and the adhesive layer 410 from being damaged by external oxygen, water, etc. the barrier film 420 may be a flexible material capable of flexible encapsulation, and may be made of an inorganic material such as SiOx and SiNx, or an organic material such as acryl or polyimide.

The anisotropic diffusion film 500 is arranged on the barrier film 420. The anisotropic diffusion film 500 has a diffusion property varied depending on an incident angle of incident light incident on the anisotropic diffusion film 500. The anisotropic diffusion film 500 according to one embodiment of the present invention includes two or more diffusion layers. The anisotropic diffusion film 500 according to one embodiment of the present invention includes a first diffusion layer 510 and a second diffusion layer 520 arranged on the first diffusion layer 510.

The first diffusion layer 510 is arranged such that a first resin layer 511 and a first optical pattern 512, which have their respective refractive indexes different from each other, are repeated. The second diffusion layer 520 is arranged such that a second resin layer 521 and a second optical pattern 522, which have their respective refractive indexes different from each other, are repeated. At this time, the first optical pattern 512 and the second optical pattern 522 are symmetrical to each other. The first optical pattern 512 and the second optical pattern 522 according to one embodiment may be symmetrical to each other based on a boundary between the first diffusion layer 510 and the second diffusion layer 520. The first diffusion layer 510 and the second diffusion layer 520 have their respective diffusion properties different from each other with respect to the same incident angle by the first optical pattern and the second optical pattern, which are symmetrical to each other and headed for their respective directions different from each other. That is, the anisotropic diffusion film 500 according to one embodiment of the present invention may be diffused by the first diffusion layer 510 if an incident direction of incident light is one side, and may be diffused by the second diffusion layer 520 if the incident direction of the incident light is the other side. Therefore, the organic light emitting display device according to the first embodiment of the present invention may fully diffuse the incident light, which enters both sides, through the anisotropic diffusion film 500 having a plurality of diffusion layers.

The first resin layer 511 is a layer constituting the form of the first diffusion layer 510, and is made of a relatively low refractive medium as compared with the first optical pattern 512. The second resin layer 521 is a layer constituting the form of the second diffusion layer 520, and is made of a relatively low refractive medium as compared with the second optical pattern 522. If light emitted from the organic light emitting diode 260 enters the first resin layer 511 and the second resin layer 512, the light is transmitted without being diffused. The first resin layer 511 and the second resin layer 512 according to one embodiment may be made of a resin or air layer of a transparent material, for example, include one or more of silicon resin, epoxy resin, and acrylate resin. Also, the first resin layer 511 and the second resin layer 512 according to one embodiment may be asymmetrical to each other. The first resin layer X1 between an upper end of the first optical pattern 512 and an upper end of the first diffusion layer 510 may be removed, and the second resin layer X2 between an upper end of the second optical pattern 522 and an upper end of the second diffusion layer 520 may be removed. Also, the first resin layer 511 surrounding the outside of the first diffusion layer 510 may be removed after the first optical pattern 512 is provided, and the second resin layer 521 surrounding the outside of the second diffusion layer 520 may be removed after the second optical pattern 522 is provided. However, the first resin layer 511 and the second resin layer 521 are not limited to this example.

The first optical pattern 512 is a pattern provided inside the first resin layer 511, and is made of a relatively high refractive medium as compared with the first resin layer 511. The second optical pattern 522 is a pattern provided inside the second resin layer 521, and is made of a relatively high refractive medium as compared with the second resin layer 521. If light emitted from the organic light emitting diode 260, entering the first diffusion layer 510 enters the first optical pattern 512 and an incident angle is within an optical diffusion incident angle area, the incident light is diffused to one side by the first optical pattern 512. Also, if the light emitted from the organic light emitting diode 260, entering the second diffusion layer 520 enters the second optical pattern 522 and an incident angle is within an optical diffusion incident angle area, the incident light is diffused to the other side by the second optical pattern 522.

As described above, in the organic light emitting display device according to the first embodiment of the present invention, as the anisotropic diffusion film 500 is arranged on a light-emission surface, among the light emitted from the organic light emitting diode 260, the light emitted at a light diffusion incident angle of the first and second optical patterns 512 and 522 is diffused and then emitted. Therefore, in the organic light emitting display device according to the first embodiment of the present invention, light emitted from the organic light emitting diode 260 to the side is partially diffused, whereby side luminance may be increased to prevent side luminance deterioration and non-uniform luminance from occurring. Also, in the organic light emitting display device according to the first embodiment of the present invention, bluish light condensed to the side and then emitted is diffused to a broad area without being emitted as it is, whereby the bluish light condensed to the side only may be dispersed and thus color deviation may be reduced. Also, in the organic light emitting display device according to the first embodiment of the present invention, yellowish light that may be condensed to the side and then emitted may be diffused to the broad area together with the bluish light, whereby relative intensity of the bluish light condensed to the side only may be reduced and thus color deviation may be reduced.

The polarizer 600 is arranged on the anisotropic diffusion film 500. The polarizer 600 shields external light entering the organic light emitting display device from being reflected, whereby the external light is visible to a user and picture quality may be prevented from being deteriorated. The polarizer 600 according to one embodiment may be a circular polarizer.

Figure 4:
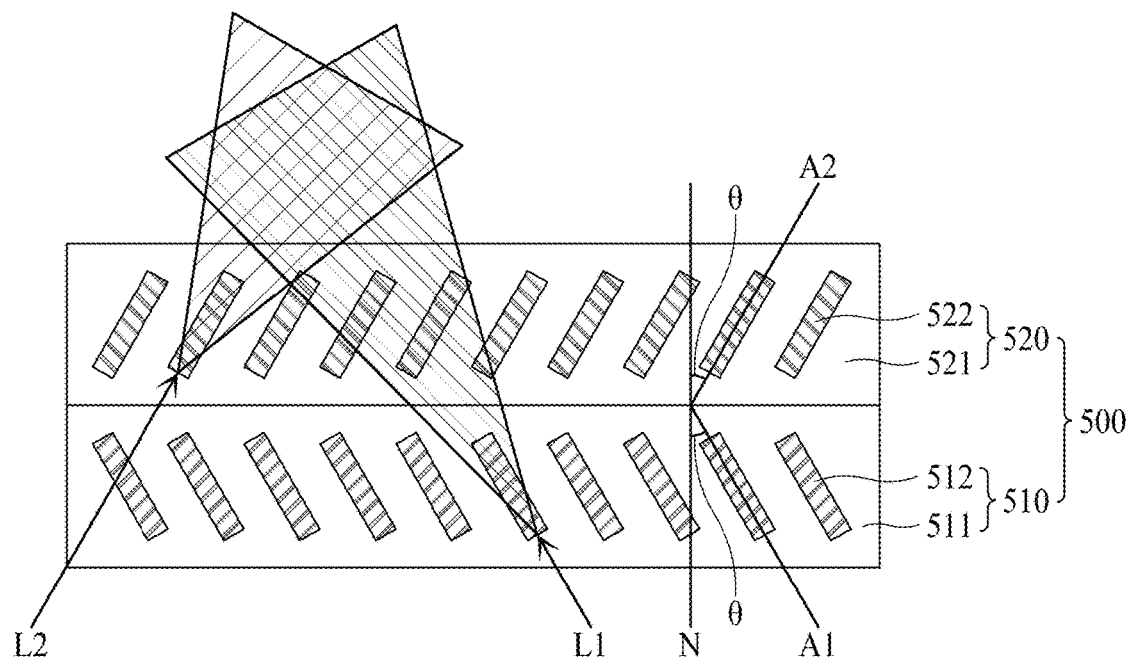
FIG. 4 is a cross-sectional view illustrating that light is diffused by an anisotropic diffusion film according to one embodiment of the present invention.

FIG. 4 is a cross-sectional view illustrating that light is diffused by an anisotropic diffusion film according to one embodiment of the present invention.

Referring to FIG. 4, the anisotropic diffusion film 500 according to one embodiment of the present invention includes a first diffusion layer 510 on which the first optical pattern 512 is arranged, and a second diffusion layer 520 on which the second optical pattern 522 is arranged. Each of the first and second optical patterns 512 and 522 has a diffusion axis, and a polar angle $\theta$ ($-90° < \theta < 90°$) between a normal line of the anisotropic diffusion film 500 and the diffusion axis may be defined as a diffusion axis angle.

The first optical pattern 512 has a first diffusion axis A1, and the second optical pattern 522 has a second diffusion axis A2. The first diffusion axis A1 and the second diffusion axis A2 may be symmetrical to each other. At this time, the first diffusion axis A1 and the second diffusion axis A2 according to one embodiment may be symmetrical to each other based on the boundary between the first diffusion layer 510 and the second diffusion layer 520.

In the anisotropic diffusion film 500 according to one embodiment of the present invention, if first incident light L1 emitted from the organic light emitting diode 260, entering one side of the anisotropic diffusion film 500 enters the first optical pattern 512 and is parallel with the first diffusion axis A1 or within the optical diffusion incident angle area, the first incident light L1 is diffused by the first optical pattern 512. The first optical pattern 512 which is an area having a high refractive index in the anisotropic diffusion film 500 refracts the first incident light while changing a direction of the first incident light L1, whereby a moving direction of the light is not uniform and thus the light is diffused. Also, the first incident light L1 entering the first optical pattern 512 may be diffused while being diffracted within the first optical pattern 512 which is narrow. The light diffused by the first optical pattern 512 transmits the second optical pattern 522, of which diffusion axis is symmetrical to the first optical pattern 512, as it is and then is emitted from the anisotropic diffusion film 500.

Also, the anisotropic diffusion film 500 according to one embodiment of the present invention transmits second incident light L2 emitted from the organic light emitting diode 260, entering the other side of the anisotropic diffusion film 500, as it is. Since the second incident light L2 is the light incident from an opposite side of the first incident light L1 and departs from the optical diffusion incident angle area of the first diffusion layer 510, the second incident light L2 is transmitted as it is. If the second incident light L2 that has transmitted the first diffusion layer 510 enters the second optical pattern 522 and is parallel with the second diffusion axis A2 or within the optical diffusion incident angle area, the second incident light L2 is diffused by the second optical pattern 522 and then emitted from the anisotropic diffusion film 500. The second incident light L2 is refracted by the second optical pattern 522, and is additionally diffracted and then diffused. As described above, the anisotropic diffusion film 500 according to one embodiment of the present invention may diffuse all of the incident lights entering both sides through a plurality of diffusion layers having their respective diffusion axes different from each other.

At this time, the anisotropic diffusion film 500 according to one embodiment of the present invention has an absolute value of a sum of the first diffusion axis A1 angle of the first optical pattern 512 and the second diffusion axis A2 angle of the second optical pattern 522 in the range of 30° or more. If the absolute value of the sum of the first diffusion axis A1 angle and the second diffusion axis A2 angle is smaller than 30°, the first and second diffusion axes A1 and A2 become close to the normal line. If the first and second diffusion axes become close to the normal line, incident light emitted from the organic light emitting diode 260, entering a front surface of the anisotropic diffusion film 500 rather than incident light emitted from the organic light emitting diode 260, entering the side of the anisotropic diffusion film 500 may be diffused. If the incident light entering the front surface of the anisotropic diffusion film 500 is diffused, it may vary a color of the light normally emitted from the front surface.

Therefore, in case of the anisotropic diffusion film 500 according to one embodiment of the present invention, as the absolute value of the sum of the first diffusion axis A1 angle and the second diffusion axis A2 angle has 30° or more, the light emitted from the organic light emitting diode 260 to the side may be diffused partially to prevent non-uniform luminance from occurring, and the bluish light condensed to the side and then emitted may be diffused to reduce color deviation.

Figure 5:
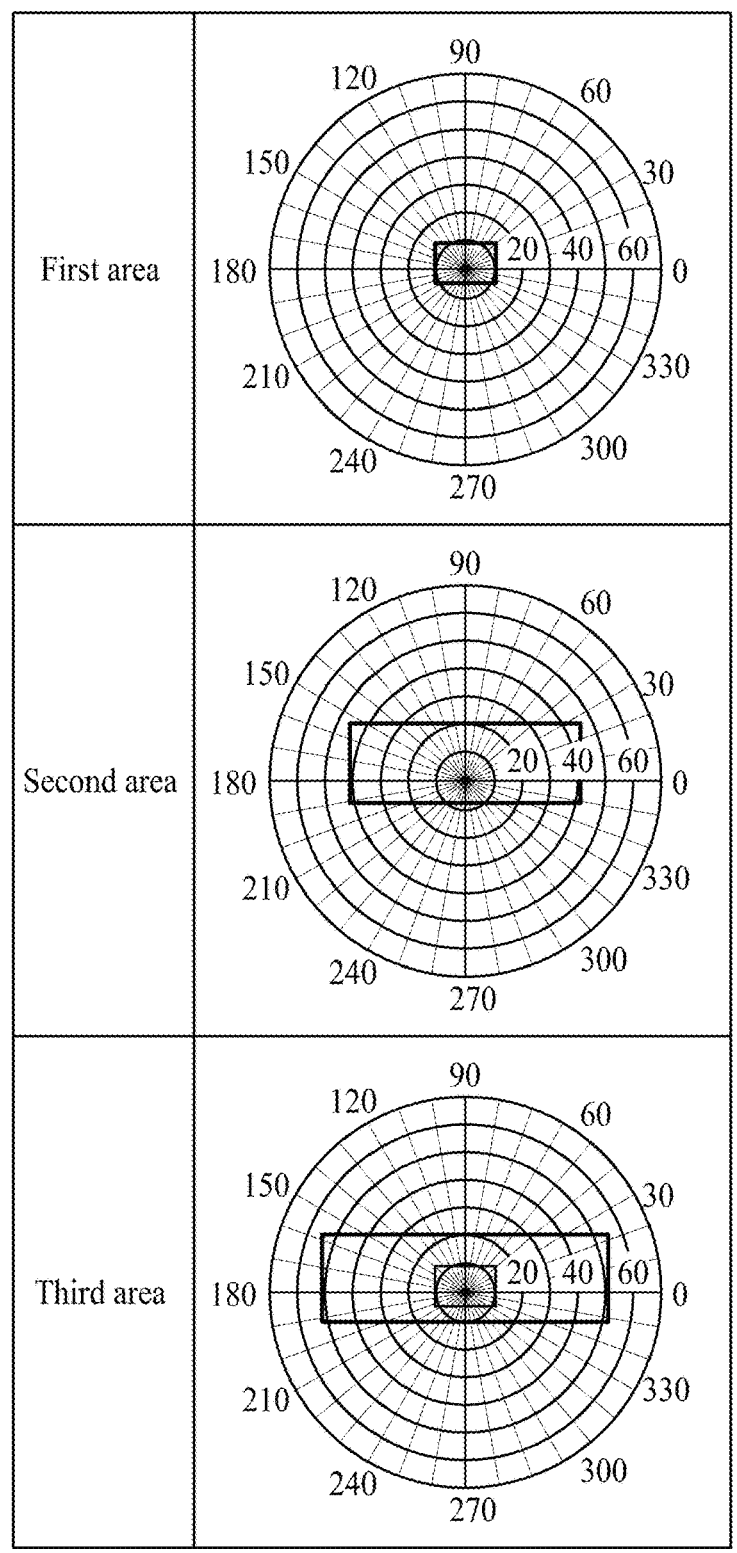
FIG. 5 illustrates an optical profile area on a front surface of an organic light emitting display device.
Figure 6:
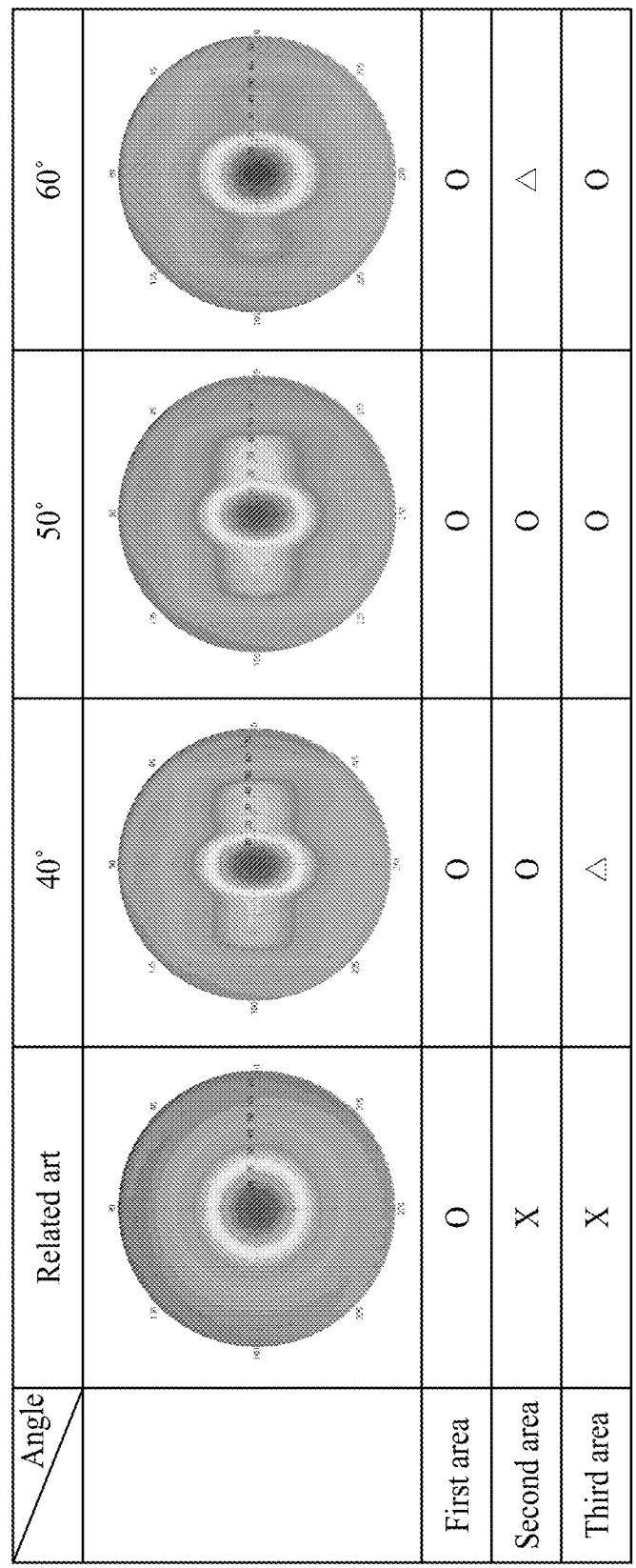
FIG. 6 illustrates an optical profile of an organic light emitting display device according to a diffusion axis angle of an optical pattern.

FIG. 5 illustrates an optical profile area on a front surface of an organic light emitting display device. FIG. 6 illustrates an experimental result of an optical profile of an organic light emitting display device according to a diffusion axis angle of an optical pattern.

Referring to FIG. 5, a first area in an optical profile on the front surface of the organic light emitting display device may be defined as an area corresponding to an area from −10° to +10° in a horizontal direction and an area from −4° to +8° in a vertical direction. A second area may be defined as an area corresponding to an area from −40° to +40° in a horizontal direction and an area from −10° to +20° in a vertical direction. A third area may be defined as an area corresponding to an area from −50° to +50° in a horizontal direction and an area from −10° to +20° in a vertical direction. That is, the first area is a center area of the organic light emitting display device, and the second and third areas are areas slightly deviated from the center area to the side. When reference luminance of the first area is 600 nit, reference luminance of the second area is 320 nit, and reference luminance of the third area is 220 nit, it is supposed that luminance of the first area is 100%. In this case, when luminance of the second area is 53.3% as compared with the first area and luminance of the third area is 36.7% as compared with the first area, the organic light emitting display device may realize high definition.

Referring to FIG. 6, in case of the organic light emitting display device of the related art to which the anisotropic diffusion film 500 of the present invention is not applied, luminance of a first area is high but luminance of the second area and luminance of the third area do not reach the reference of 53.3% and the reference of 36.7% as compared with the first area, respectively, whereby side luminance deterioration and non-uniform luminance may occur.

In the organic light emitting display device in which the absolute value of the sum of the first diffusion axis A1 angle and the second diffusion axis A2 angle is 40° in the anisotropic diffusion film 500 of the present invention, luminance of the second area exceeds the reference of 53.3% as compared with the first area and luminance of the third area is close to the reference value of 36.7% as compared with the first area, whereby side luminance is more increased than that of the organic light emitting display device of the related art.

In the organic light emitting display device in which the absolute value of the sum of the first diffusion axis A1 angle and the second diffusion axis A2 angle is 50° in the anisotropic diffusion film 500 of the present invention, luminance of the second area exceeds the reference of 53.3% as compared with the first area and luminance of the third area also exceeds the reference value of 36.7% as compared with the first area, whereby side luminance is more increased than that of the organic light emitting display device of the related art and thus overall luminance becomes uniform.

In the organic light emitting display device in which the absolute value of the sum of the first diffusion axis A1 angle and the second diffusion axis A2 angle is 60° in the anisotropic diffusion film 500 of the present invention, luminance of the third area exceeds the reference of 36.7% as compared with the first area and luminance of the second area is close to the reference value of 53.3% as compared with the first area, whereby side luminance is more increased than that of the organic light emitting display device of the related art and thus overall luminance becomes uniform. If the luminance is close to the reference value of luminance as compared with the first area, the luminance may exceed the reference value through fine current control only.

Therefore, according to the experimental result of FIG. 6, as compared with the organic light emitting display device of the related art, the anisotropic diffusion film 500 having an absolute value of a sum of the first diffusion axis A1 angle and the second diffusion axis A2 angle in the range of 30° or more is applied to a light emission surface of the organic light emitting display device, whereby it is noted that side luminance is increased and overall luminance becomes uniform.

Figure 7:
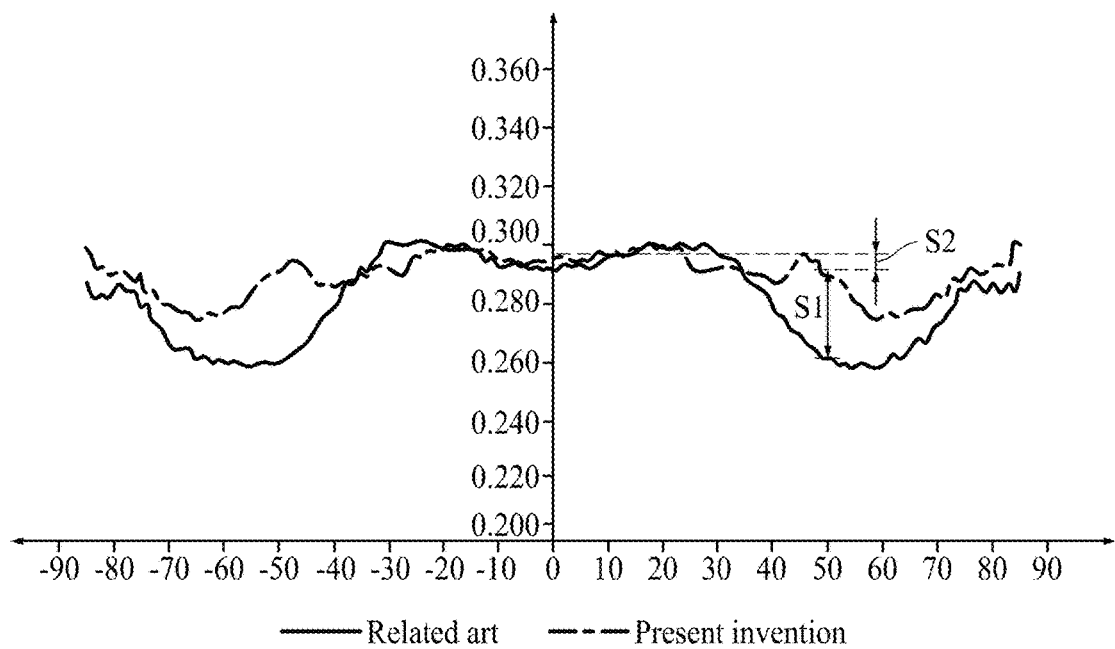
FIG. 7 is a graph illustrating color deviation according to a viewing angle between an organic light emitting display device of the related art and an organic light emitting display device according to the first embodiment of the present invention.

FIG. 7 is a graph illustrating color deviation according to a viewing angle between an organic light emitting display device of the related art and an organic light emitting display device according to the first embodiment of the present invention.

X-axis denotes a viewing angle, and Y-axis denotes X-axis of a color coordinate. The center of the graph denotes a viewing angle viewed from a front surface of the organic light emitting display device, and the viewing angle is varied from the front surface to the side if an absolute value of the X-axis becomes greater. Therefore, the graph of FIG. 7 denotes a variation of a color seen in accordance with the viewing angle of the organic light emitting display device of the related art and the viewing angle of the organic light emitting display device of the present invention.

Referring to FIG. 7, the organic light emitting display device of the related art indicates a color coordinate of about 0.260 when the absolute value of the viewing angle is 50°. Also, the organic light emitting display device of the related art indicates a color coordinate of about 0.290 when the viewing angle is 0°. Therefore, the organic light emitting display device of the related art has color deviation S1 of about 0.030 when the viewing angle moves to the side as much as 50° from 0°. That is, in the organic light emitting display device of the related, when an image is viewed from the front surface and the side, its color is viewed differently as much as a difference of 0.030, and especially bluish light may be seen.

The organic light emitting display device of the present invention indicates a color coordinate of about 0.290 when the absolute value of the viewing angle is 50°. Also, the organic light emitting display device according to the first embodiment of the present invention indicates a color coordinate of about 0.295 when the viewing angle is 0°. That is, the organic light emitting display device according to the first embodiment of the present invention has color deviation S2 of about 0.005 when the viewing angle moves to the side as much as 50° from 0°. Therefore, as the anisotropic diffusion film 500 is applied to the organic light emitting display device according to the first embodiment of the present invention, it is noted that color deviation is reduced as compared with the organic light emitting display device of the related art.

Figure 8:
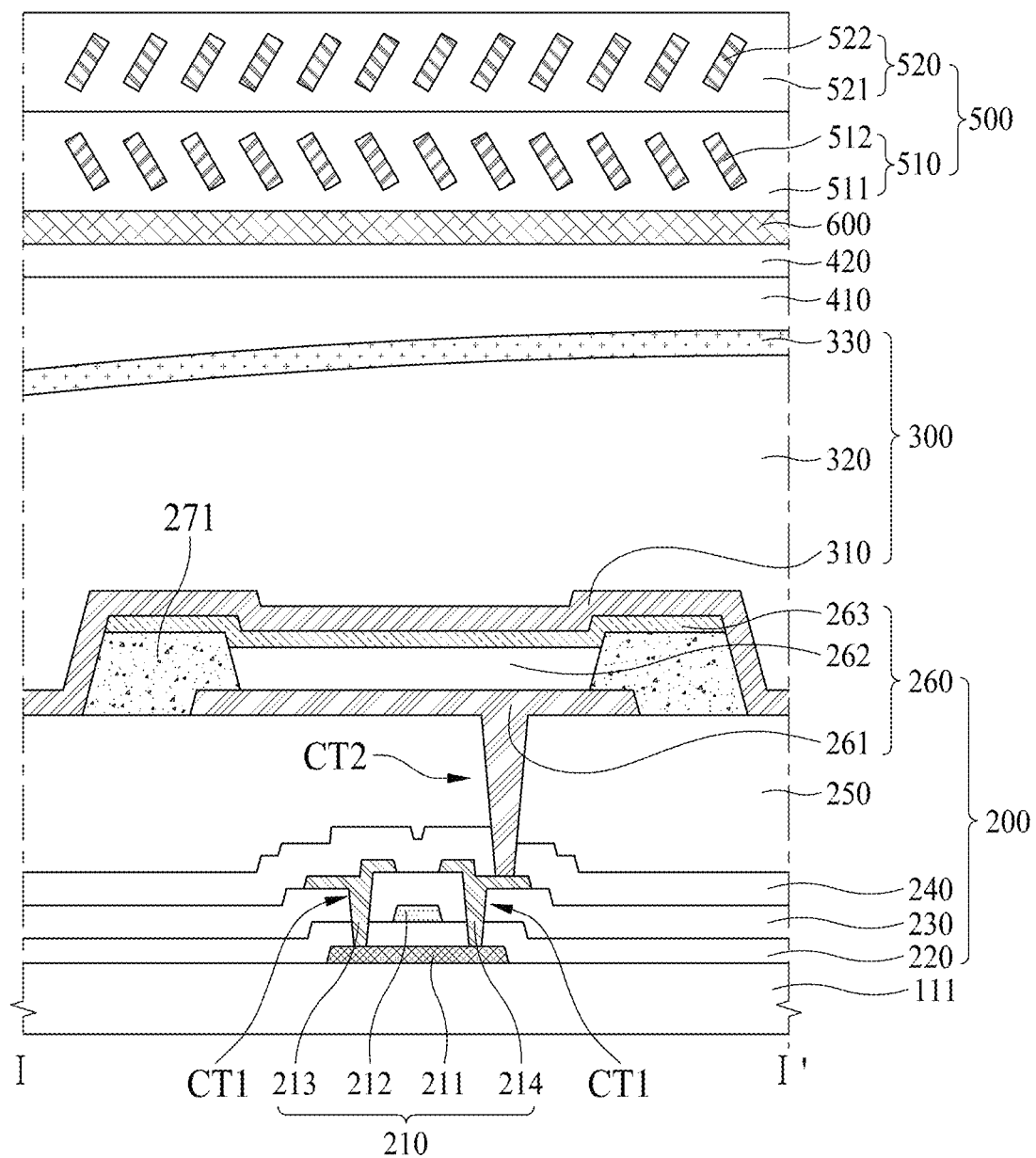
FIG. 8 is a cross-sectional view taken along line I-I' of FIG. 2, illustrating an organic light emitting display device according to the second embodiment of the present invention.

FIG. 8 is a cross-sectional view taken along line I-I' of FIG. 2, illustrating an organic light emitting display device according to the second embodiment of the present invention. The organic light emitting display device shown in FIG. 8 is the same as that according to the first embodiment described with reference to FIGS. 1 to 3 except the position of the anisotropic diffusion film 500. Therefore, in the following description, only the organic light emitting layer 260 will be described, and repeated description of the same elements will be omitted.

Referring to FIG. 8, in the organic light emitting display device according to the second embodiment of the present invention, the anisotropic diffusion film 500 is arranged above the polarizer 600. Therefore, in the second organic light emitting display device according to the second embodiment of the present invention, since the process of forming the anisotropic diffusion film 500 is added to the process of manufacturing the organic light emitting display device of the related art, this process may be applied to the existing process without big change in the existing manufacturing process. Also, unlike the first embodiment in which light diffused from the anisotropic diffusion film 500 is externally emitted through the polarizer 600, in the organic light emitting display device according to the second embodiment of the present invention, light emitted from the anisotropic diffusion film 500 is externally emitted without through the polarizer 600, whereby luminance may be increased.

Figure 9:
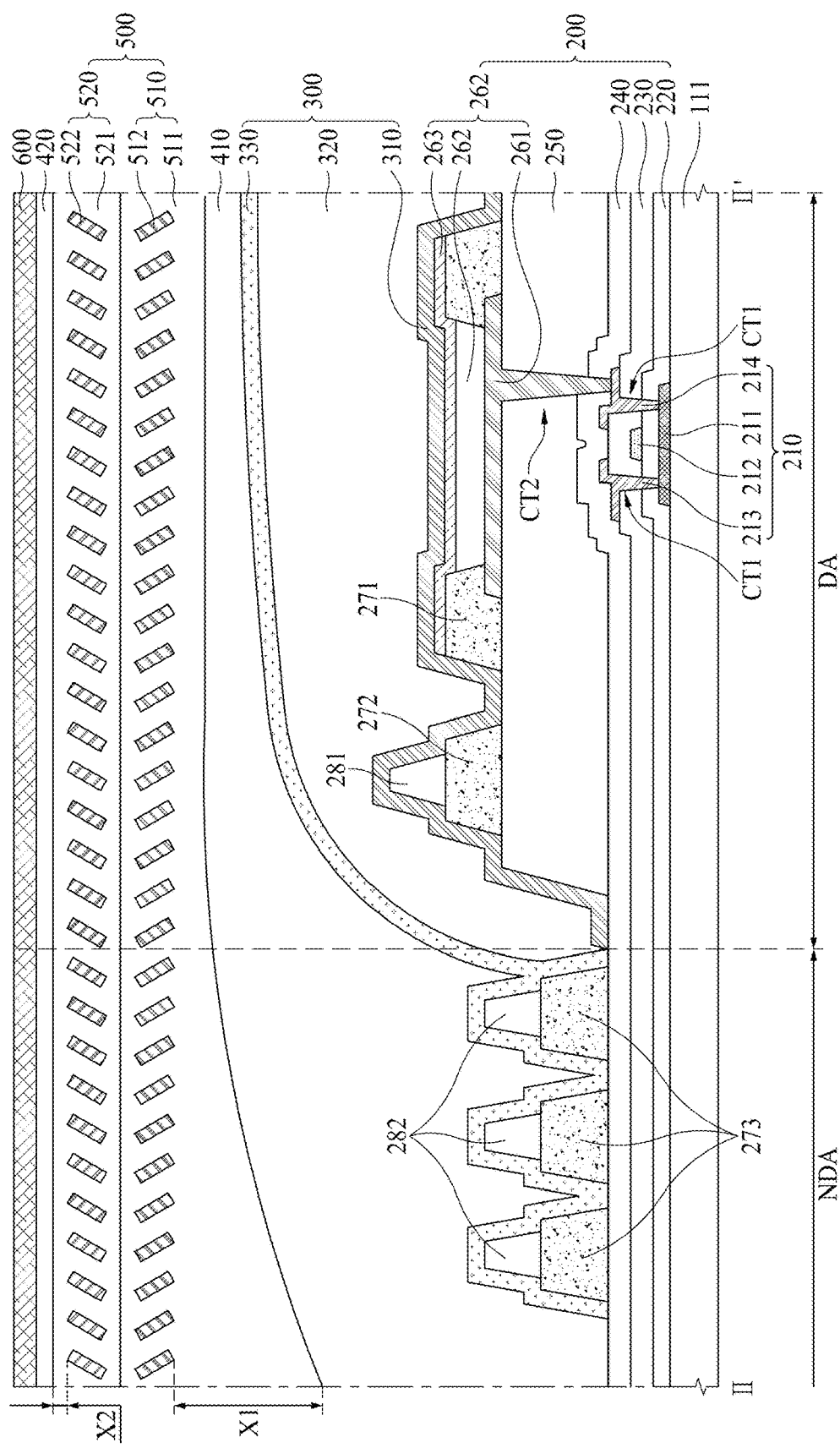
FIG. 9 is a cross-sectional view taken along line II-II' of FIG. 2, illustrating an organic light emitting display device according to the third embodiment of the present invention.

FIG. 9 is a cross-sectional view taken along line II-II' of FIG. 2, illustrating an organic light emitting display device according to the third embodiment of the present invention. The organic light emitting display device shown in FIG. 9 is a sectional view of a non-display area and a display area, wherein the display area is the same as that of the organic light emitting display device according to the first embodiment described with reference to FIGS. 1 to 3 except the anisotropic diffusion film 500. Therefore, in the following description, the non-display area, the anisotropic diffusion film 500, and elements which may be added will be described, and repeated description of the same elements will be omitted.

Referring to FIG. 9, the organic light emitting display device according to the third embodiment of the present invention comprises a display area DA where pixels P are formed to display an image and a non-display area NDA where an image is not displayed.

The display area DA includes a first substrate 111, a pixel array layer 200, an encapsulation layer 300, an adhesive layer 410, an anisotropic diffusion film 500, a barrier film 420, and a polarizer 600.

In the organic light emitting display device according to the third embodiment of the present invention, the pixel array layer 200, the encapsulation layer 300 and the adhesive layer 410 are sequentially arranged on the first substrate 111, and the anisotropic diffusion film 500 is arranged on the adhesive layer 410.

The anisotropic diffusion film 500 includes a first diffusion layer 510 and a second diffusion layer 520 arranged on the first diffusion layer 510.

A plurality of first optical patterns 512 are arranged inside a first resin layer 511 of the first diffusion layer 510. The first resin layer 511 surrounds the first optical patterns 512. In the organic light emitting display device according to the third embodiment of the present invention, a lower portion X1 of the first resin layer 511 is thicker than an upper portion of the first resin layer 511 based on the first optical patterns 512. In more detail, the first resin layer 511 is thickly provided at a thickness X1 from a portion, which adjoins an end below the first optical pattern 512, to a portion that adjoins the adhesive layer 410. The first layer 511 is made of a transparent resin, and may have flexibility like the adhesive layer 410. Therefore, the first resin layer 511 may planarize a lower surface which is not planarized, by compensating for the adhesive layer 410. The adhesive layer 410 is a urethane based material, and is made of a relatively higher cost than the first resin layer 511 made of resin or air layer. Therefore, in the organic light emitting display device according to the third embodiment of the present invention, the thickness of the adhesive layer 410 of high cost may be reduced and the thickness of the first resin layer 511 may be increased, whereby the cost may be reduced.

Also, in the organic light emitting display device according to the third embodiment of the present invention, a second bank 272 and a first spacer 281 may be arranged on a planarization film 250 close to the non-display area NDA. The first spacer 281 is arranged on the second bank 272, and is higher than the first bank 271. The second bank 272 and the first spacer 281 prevent an organic film 320 arranged at an upper portion from overflowing to the non-display area NDA. The organic film 320 is arranged to fully cover the display area DA, and is arranged to have a thin thickness toward the non-display area NDA.

The non-display area NDA is provided outside the display area DA, and a driver for applying a signal to the display area DA is arranged. The non-display area NDA includes an insulating film 220, an inter-layer dielectric film 230, a passivation film 240, a third bank 273, a second spacer 282, a second inorganic film 330, an adhesive layer 410, an anisotropic diffusion film 500, a barrier film 420, and a polarizer 600, which are sequentially arranged on the first substrate 111. The insulating film 220, the inter-layer dielectric film 230, the passivation film 240, the second inorganic film 330, the adhesive layer 410, the anisotropic diffusion film 500, the barrier film 420, and the polarizer 600 are arranged to be extended from the display area DA.

The third bank 273 and the second spacer 282 are sequentially arranged on the passivation film 240. The third bank 273 and the second spacer 282 prevent the organic film 320 arranged in the display area DA from overflowing.

Meanwhile, since the non-display area NDA includes elements smaller than those of the display area DA and especially does not include the organic film 320, a step difference between the non-display area NDA and the display area DA may occur. Therefore, in the organic light emitting display device according to the third embodiment of the present invention, the non-display area NDA and the display area DA may be planarized by the adhesive layer 410 and the first resin layer 511, whereby a defect caused by the step difference may be prevented from occurring.

Figure 10A:
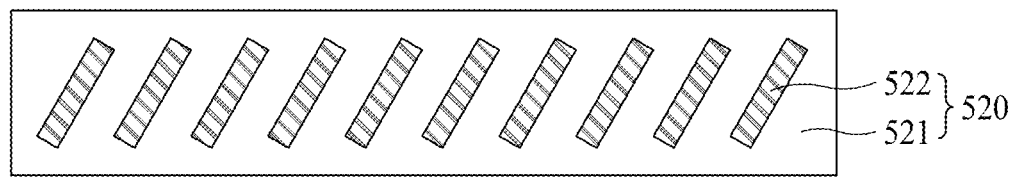
FIGS. 10a to 10c are cross-sectional views illustrating an optical pattern according to the first to third embodiments of the present invention.
Figure 10B:
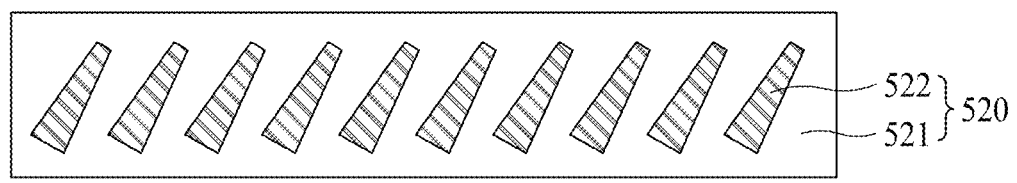
Figure 10C:
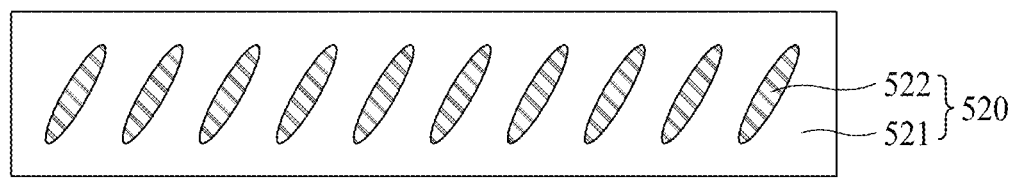

FIGS. 10a to 10c are cross-sectional views illustrating an optical pattern according to the first to third embodiments of the present invention.

An optical pattern 522 according to the first to third embodiments of the present invention may have a plate shape or a streamlined shape. Referring to FIG. 10a, the optical pattern 522 may have a rectangular section. The rectangular shaped optical pattern 522 has an incident surface having the same shape as that of an emission surface, wherein light emitted from an organic light emitting diode 260 enters the incident surface. That is, a diffusion range when the incident light enters the second optical pattern 522 is the same as a diffusion range when the incident light is emitted. Therefore, the optical pattern 522 according to the first embodiment of the present invention has a uniform diffusion range.

Referring to FIG. 10b, the optical pattern 522 may have a trapezoidal shaped section. The trapezoidal shaped optical pattern 522 has an incident surface having a shape different from that of an emission surface, wherein light emitted from the organic light emitting diode 260 enters the incident surface. That is, a diffusion range when the incident light enters the second optical pattern 522 is different from a diffusion range when the incident light is emitted. Therefore, the optical pattern 522 according to the second embodiment of the present invention may enter more incident lights and emit light having a small diffusion range.

Referring to FIG. 10c, the optical pattern 522 may have a streamlined shaped section. The streamlined shaped optical pattern 522 may have a curvature at an end, whereby an aperture ratio of the organic light emitting display device may be increased.

Figure 11A:
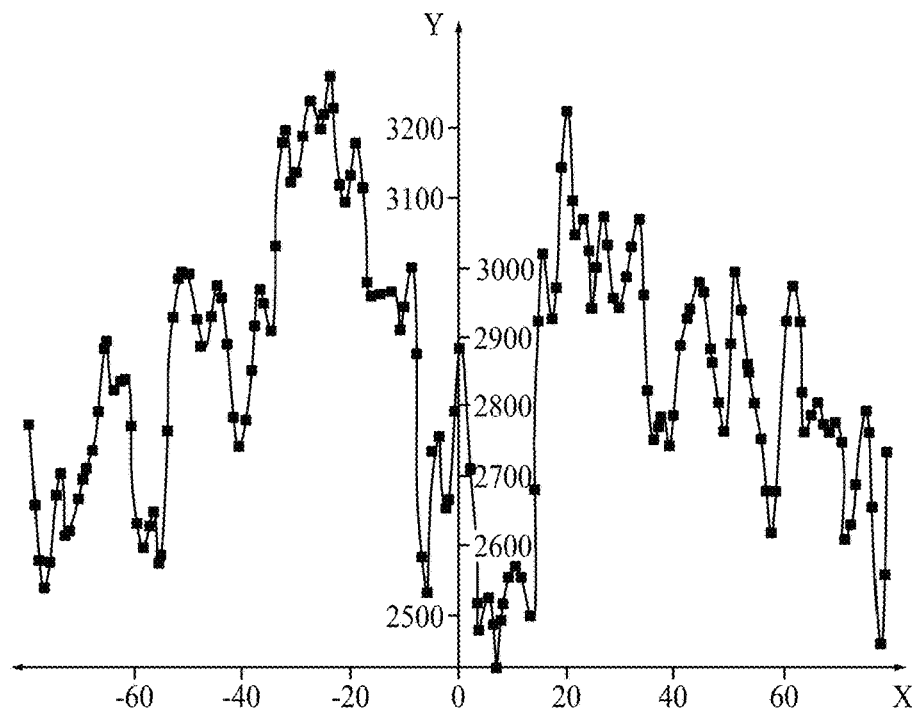
FIG. 11a is a graph illustrating a light diffusion range according to a viewing angle when an anisotropic diffusion film according to one embodiment of the present invention is applied to a liquid crystal display device.
Figure 11B:
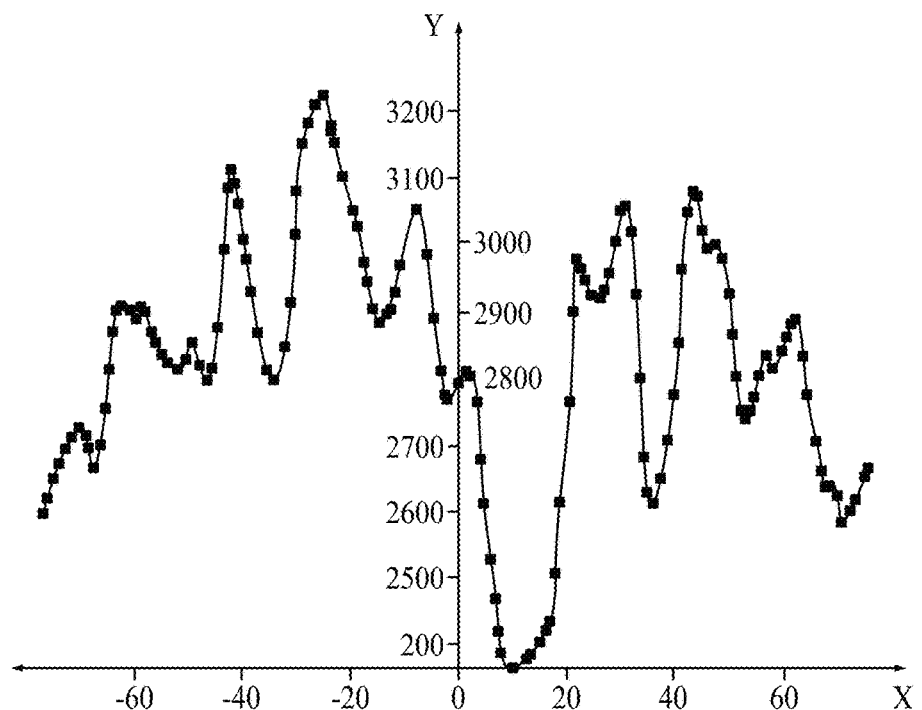
FIG. 11b is a graph illustrating a light diffusion range according to a viewing angle of an organic light emitting display device according to the first embodiment of the present invention.

FIG. 11a is a graph illustrating a light diffusion range according to a viewing angle when an anisotropic diffusion film according to one embodiment of the present invention is applied to a liquid crystal display device, and FIG. 11b is a graph illustrating a light diffusion range according to a viewing angle of an organic light emitting display device according to the first embodiment of the present invention.

The anisotropic diffusion film applied to FIGS. 11a and 11b has an absolute value of a sum of the first diffusion axis A1 angle and the second diffusion axis A2 angle in the range of 30°.

Referring to FIGS. 11a and 11b, when the anisotropic diffusion film 500 according to one embodiment of the present invention is applied to the liquid crystal display device, the light diffusion range has a value of about 2750 if the absolute value of the viewing angle is in the range of 40°. On the other hand, the organic light emitting display device according to the first embodiment of the present invention has a light diffusion range of about 3100 when the absolute value of the viewing angle is in the range of 40°. That is, a broader light diffusion range may be obtained when the anisotropic diffusion film 500 according to one embodiment of the present invention is applied to the organic light emitting display device according to the first embodiment of the present invention than the case that the anisotropic diffusion film 500 is applied to the liquid crystal display device.

The reason why that the broader light diffusion range may be obtained when the anisotropic diffusion film 500 is applied to the organic light emitting display device according to the first embodiment of the present invention is as follows. In the liquid crystal display device, as light emitted from a light source transmits a light guide plate, an incident angle of incident light entering the anisotropic diffusion film 500 is reduced once. On the other hand, in the organic light emitting display device according to the first embodiment of the present invention, as light emitted from the organic light emitting diode 260 transmits each of the adhesive layer 410 and the barrier film 420, the incident angle of incident light entering the anisotropic diffusion film 500 is reduced by being changed twice. Therefore, even though the same anisotropic diffusion film 500 is applied to the liquid crystal display device and the organic light emitting display device according to the first embodiment of the present invention, a difference occurs in a light diffusion range according to the viewing angle. In this way, as the organic light emitting display device according to the first embodiment of the present invention has a broad light diffusion range in accordance with the viewing angle, non-uniform luminance and color deviation caused by a change of the viewing angle may be prevented from occurring.

As described above, according to the embodiment of the present invention, the following advantages may be obtained.

In the organic light emitting display device according to one embodiment of the present invention, light emitted from the organic light emitting diode to the side is partially diffused, whereby side luminance may be increased to prevent side luminance deterioration and non-uniform luminance from occurring.

Also, in the organic light emitting display device according to one embodiment of the present invention, bluish light condensed to the side and then emitted is diffused to a broad area without being emitted as it is, whereby the bluish light condensed to the side only may be dispersed and thus color deviation may be reduced.

Also, in the organic light emitting display device according to one embodiment of the present invention, the thickness of the adhesive layer of high cost may be reduced, and the thickness of the first resin layer may be increased to planarize the lower surface which is not planarized.

It will be apparent to those skilled in the art that various modifications and variations can be made in the organic light emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
 a first substrate having a display area and a non-display area;
 an organic light emitting diode in the display area of the first substrate; and
 an anisotropic diffusion film on the organic light emitting diode, having a diffusion property varied depending on an incident angle,
 wherein the anisotropic diffusion film includes a first resin layer and a first optical pattern inside the resin,
 wherein the first optical pattern is level relative to the first substrate, and
 wherein the first resin layer has a varied lower surface to planarize a surface under the anisotropic diffusion film.

2. The organic light emitting display device of claim 1, wherein anisotropic diffusion film further includes a second diffusion layer having a second optical pattern, and the first and second optical patterns are symmetrical to each other.

3. The organic light emitting display device of claim 2, wherein each of the first and second optical patterns has a diffusion axis, and if a polar angle θ (−90°<θ<90°) between a normal line of the anisotropic diffusion film and the diffusion axis is defined as a diffusion axis angle, a sum of a first diffusion axis angle of the first optical pattern and a second diffusion axis of the second optical pattern has an absolute value in the range of 30° or more.

4. The organic light emitting display device of claim 2, wherein the first and second optical patterns have a plate shape or a streamlined shape, and has one of a square shaped section, a rectangular shaped section, a trapezoidal shaped section, and a streamlined shaped section.

5. The organic light emitting display device of claim 2, wherein the second diffusion layer includes a second resin layer and the second optical pattern is inside the second resin layer, and wherein an upper end of the second optical pattern is at an upper surface of the second resin layer of the second diffusion layer.

6. The organic light emitting display device of claim 1, further comprising:
an encapsulation layer on the organic light emitting diode;
an adhesive layer on the encapsulation layer;
a barrier film on the adhesive layer, wherein the anisotropic diffusion film is on the barrier film; and
a polarizer on the anisotropic diffusion film.

7. The organic light emitting display device of claim 1, further comprising:
an encapsulation layer on the organic light emitting diode;
an adhesive layer on the encapsulation layer;
a barrier film on the adhesive layer; and
a polarizer on the barrier film, wherein the anisotropic diffusion film is on the polarizer.

8. The organic light emitting display device of claim 1, wherein the display area of the first substrate includes:
a thin film transistor on the first substrate;
a planarization film on the thin film transistor;
the organic light emitting diode on the planarization film and electrically connected with the thin film transistor; and
a first inorganic film, an organic film and a second inorganic film sequentially on the organic light emitting diode,
wherein the second inorganic film extends to the non-display area of the first substrate.

9. The organic light emitting display device of claim 8, wherein the anisotropic diffusion film includes a first diffusion layer and a second diffusion layer having a second optical pattern therein on the first diffusion layer,
wherein the first diffusion layer includes the first resin layer and the first optical pattern provided inside the first resin layer, and
wherein a lower portion of the first resin layer is thicker than an upper portion of the first resin layer based on a center of the first optical pattern.

10. The organic light emitting display device of claim 9, further comprising an adhesive layer on the second inorganic film, wherein the first diffusion layer is on the adhesive layer.

11. The organic light emitting display device of claim 8, further comprising:
a first bank that adjoins the organic light emitting diode;
a second bank spaced apart from the first bank and on the planarization film; and
a first spacer on the second bank.

12. The organic light emitting display device of claim 1, wherein the anisotropic diffusion film includes:
a first diffusion layer having the first resin layer and the first optical pattern inside the first resin layer, and
a second diffusion layer on the first diffusion layer and having a second resin layer and a second optical pattern inside the second resin layer.

13. The organic light emitting display device of claim 1, wherein a lower portion of the first resin layer is thicker than an upper portion of the first resin layer based on a center of the first optical pattern.

14. The organic light emitting display device of claim 13, wherein the anisotropic diffusion film includes:
a first diffusion layer having the first resin layer and the first optical pattern inside the first resin layer, and
a second diffusion layer on the first diffusion layer and having a second resin layer and a second optical pattern inside the second resin layer.

15. An organic light emitting display device, comprising:
a first substrate having a display area and a non-display area;
an organic light emitting diode in the display area of the first substrate; and
an anisotropic diffusion film on the organic light emitting diode, having a diffusion property varied depending on an incident angle, the anisotropic diffusion film including:
a first diffusion layer having a first resin layer and a first optical pattern inside the first resin layer, and
a second diffusion layer on the first diffusion layer and having a second resin layer and a second optical pattern inside the second resin layer,
wherein a lower portion of the first resin layer is thicker than an upper portion of the first resin layer based on a center of the first optical pattern.

* * * * *